United States Patent
Weaver et al.

(10) Patent No.: US 6,202,917 B1
(45) Date of Patent: Mar. 20, 2001

(54) CO-PROCESSING OF ADHESIVE CURING AND SOLDER REFLOW IN AN ELECTRONIC ASSEMBLY OPERATION

(75) Inventors: Mark A. Weaver, Hawthorne; Lynn E. Long, Manhattan Beach; Thomas Martinez, Long Beach; Eric J. Shinaver, South Pasadena, all of CA (US)

(73) Assignee: Hughes Electronics Corporation, El Segundo, CA (US)

( * ) Notice: Subject to any disclaimer, the term of this patent is extended or adjusted under 35 U.S.C. 154(b) by 0 days.

(21) Appl. No.: 09/136,635

(22) Filed: Aug. 19, 1998

(51) Int. Cl.[7] ............ B23K 31/00; B23K 31/02; B23K 1/00; B23K 5/00
(52) U.S. Cl. .............. 228/180.21; 228/6.1; 228/6.2; 228/180.1
(58) Field of Search ............ 228/180.21, 180.1, 228/6.1, 6.2

(56) References Cited

U.S. PATENT DOCUMENTS

| | | | |
|---|---|---|---|
| 4,788,767 | * 12/1988 | Desai et al. | 29/830 |
| 4,951,400 | * 8/1990 | Elliott et al. | 34/15 |
| 5,385,966 | * 1/1995 | Hermansen et al. | 524/426 |
| 5,856,022 | * 1/1999 | McCormick et al. | 428/500 |
| 5,861,678 | * 1/1999 | Schrock | 257/783 |
| 5,985,694 | * 11/1999 | Cho | 438/108 |

* cited by examiner

Primary Examiner—Patrick Ryan
Assistant Examiner—Zidia T. Pittman
(74) Attorney, Agent, or Firm—T. Gudmestad

(57) ABSTRACT

An electronic assembly is fabricated by tinning a solder to the electrical bonding pads of a printed circuit board, and applying an adhesive, preferably a filled polyurethane adhesive, to the component that is to be bonded to the printed circuit board. The component is contacted to its bonding location on the printed circuit board, and the electrical contact on the component is contacted to the tinned bonding pads. The assembly is heated in a single solder temperature/time reflow cycle to simultaneously cure the adhesive and solder the electrical contacts to the bonding pads.

20 Claims, 4 Drawing Sheets

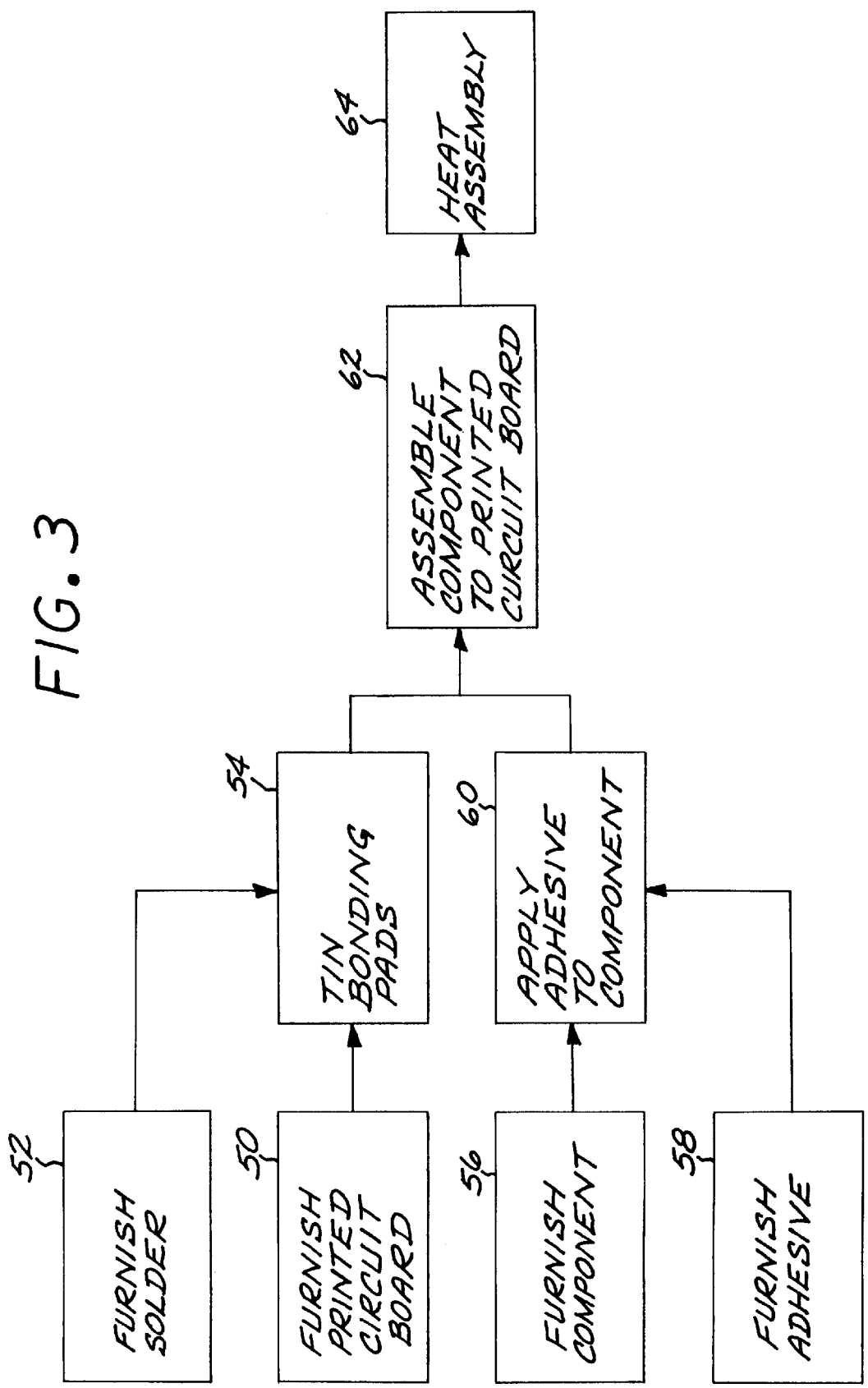

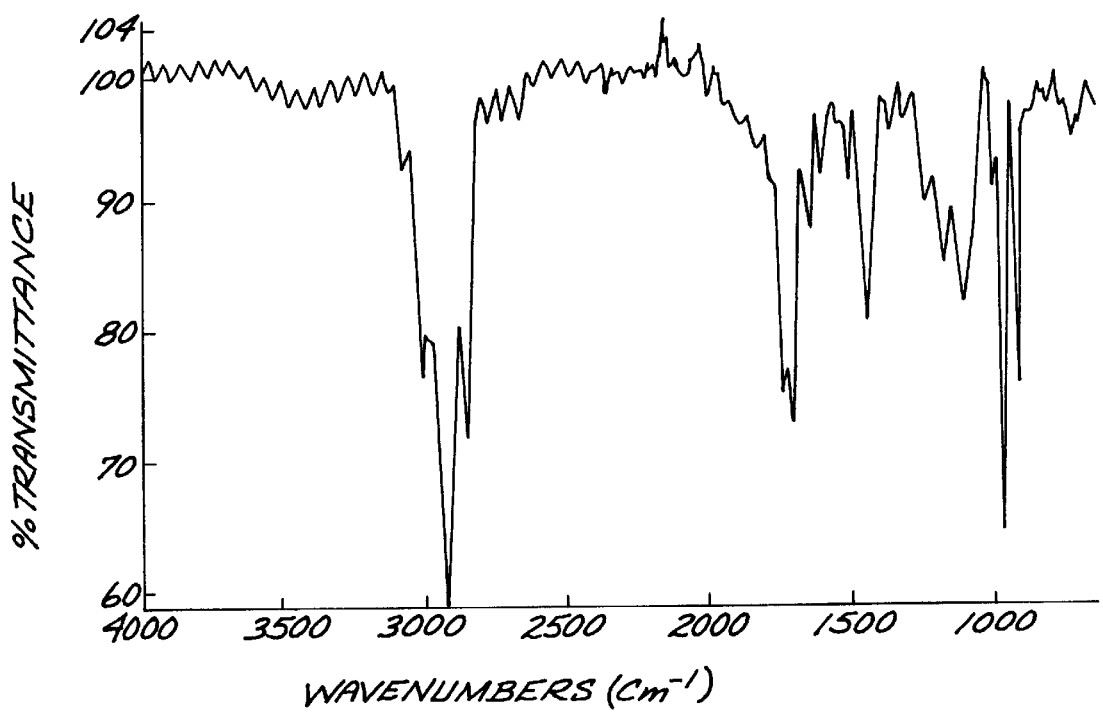
FIG. 4
FIG. 6
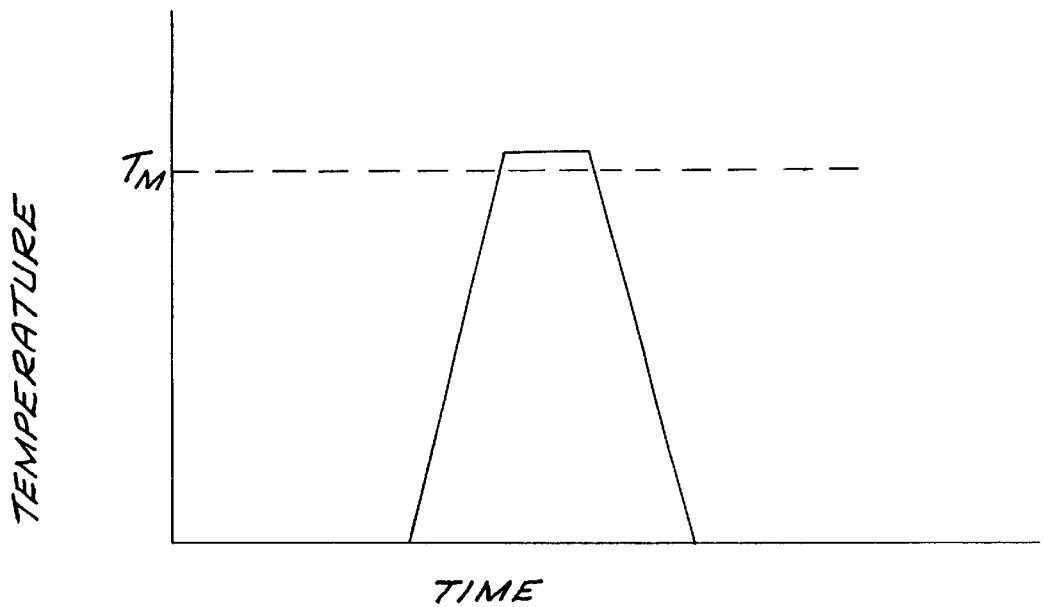

US 6,202,917 B1

CO-PROCESSING OF ADHESIVE CURING AND SOLDER REFLOW IN AN ELECTRONIC ASSEMBLY OPERATION

BACKGROUND OF THE INVENTION

This invention relates to electronic assemblies and, more particularly, to a method of assembling components to circuit boards.

A common approach to the organization of electronic systems is to divide the system into a number of subsystems, and to place each subsystem onto a circuit card. For example, in a computer the central processor and its associated circuitry may be placed onto one card, the display graphics drivers may be placed onto another card, the driver for each input/output device may be on an individual card, and power-related functions may be on another card. On each of the cards, components are affixed to the surface of the card, and linked by wires or electrically conductive paths termed traces. The cards are linked by wires or by plug-in connectors. This architecture provides an organization which permits individual functions to be repaired, added, or removed easily.

To fabricate a system having this type of architecture, the components are individually fabricated, and the cards are separately fabricated with the appropriate connectors and traces. The components are attached to the card, either semipermanently with mechanical attachments or permanently with adhesives. Lastly, any permanent electrical connections are made by soldering. When the electronic system is to be used in applications which must remain reliable for extended periods and/or are subjected to mechanical loadings such as shocks, it is preferred to make all attachments permanent in nature, with the components adhesively bonded to their circuit boards and the electrical interconnects permanently soldered.

Thousands of circuit boards most be fabricated for use in complex systems such as communications satellites. In the conventional practice, the components are adhesively attached to the circuit cards, and this subassembly is cured. Electrical connections are thereafter made by soldering using pre-tinned bonding pads on the circuit card. This process is time-consuming and adds significantly to the cost of the electronic systems.

There is a need for an improved approach to the assembly stage of the fabrication of electronic circuit cards. The present invention fulfills this need, and further provides related advantages.

SUMMARY OF THE INVENTION

This invention provides a method of assembling electronic circuit cards from subcomponents, and for accomplishing the electrical interconnection of the subcomponents. This approach substantially reduces the time for assembly and the use of expensive adhesive curing ovens, while producing acceptable quality of the final product.

In accordance with the invention, a method of fabricating an electronic assembly comprises the steps of furnishing a support having an electrical bonding pad thereon, furnishing metallic solder having a solder temperature/time reflow cycle, and tinning the solder to the electrical bonding pad of the support. The method further includes furnishing an electronic component having an electrical contact thereon, furnishing an adhesive having an adhesive temperature/time curing cycle permitting the adhesive to cure during the solder temperature/time reflow cycle, applying the adhesive to at least one of the component and a bonding location on the support to which the component is to be attached, and contacting the component to the bonding location and the electrical contact to the electrical bonding pad. Thereafter, the component and the support are heated to an elevated temperature following the solder temperature/time reflow cycle so that, in a single heating cycle, the adhesive is cured and the solder is simultaneously reflowed.

The selected adhesive must be properly curable during the processing used in the solder temperature/time reflow cycle. It must also not be damaged by the temperatures reached in the solder temperature/time reflow cycle, which are greater than those which are suitable for many adhesives. The adhesive must also exhibit the required mechanical and physical properties, thermal conductivity, and environmental properties for use in the electronic assembly. In the preferred approach, the solder is lead-tin eutectic-composition solder, and the adhesive is a mineral-filled (preferably aluminum oxide-filled) polyurethane produced from a polyol/carbonyl oligimer precursor.

The present approach achieves a simultaneous curing of the adhesive, to complete the mechanical connection of the components to the circuit board, and reflow of the solder, to complete the electrical connection of the components on the circuit board. In prior practice, the adhesive was first cured in a curing cycle that typically required two hours in a curing oven. The electrical interconnections were then individually soldered, a time-consuming operation. The present approach combines these two operations to require only a few minutes during the reflow cycle. Initial testing indicates that the quality of the finished product made by the present approach is at least as good as that achieved with the prior approach.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

BRIEF DESCRIPTION OF THE DRAWINGS

FIG. 3 is a block flow diagram of an approach for preparing the printed circuit board by the present approach;

FIG. 4 is an FTIR spectrum of the preferred polyurethane adhesive;

FIG. 6 is a schematic solder temperature/time reflow cycle; and

DETAILED DESCRIPTION OF THE INVENTION

Figure 1:
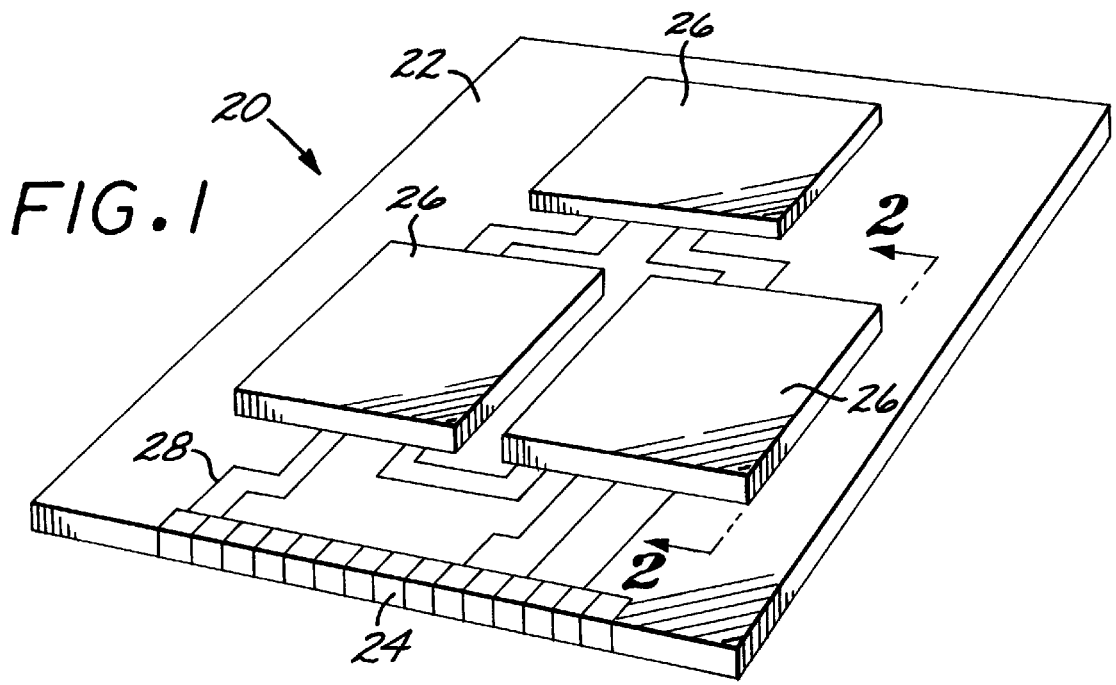
FIG. 1 is a perspective view of a printed circuit board.

FIG. 1 illustrates a printed circuit board assembly 20 of the type which is preferred for the manufacturing and assembly method discussed herein. The printed circuit board assembly 20 includes a printed circuit board 22, which is typically made of a polyimide or an epoxy-glass material. An electrical edge interconnect 24 lies along a side of the printed circuit board 22. The edge interconnect 24 provides external electrical connections through a plug-in slot (not shown).

Mounted to a face of the printed circuit board 22 is at least one, illustrated as three, components 26. Such components 26 are typically packaged integrated circuits, but may also include discrete components such as capacitors, resistors, transformers, and the like. The design of such components and their interrelations are known in the art for each specific type of system, and does not form a part of the present invention. Electrical interconnection traces 28 extend between the components 26, and between the components 26 and the edge interconnect 24. The traces 28 are layers of electrically conductive metal lying on the surface of the printed circuit board 22, and are produced by known techniques during the initial fabrication of the printed circuit board 22.

Figure 2:
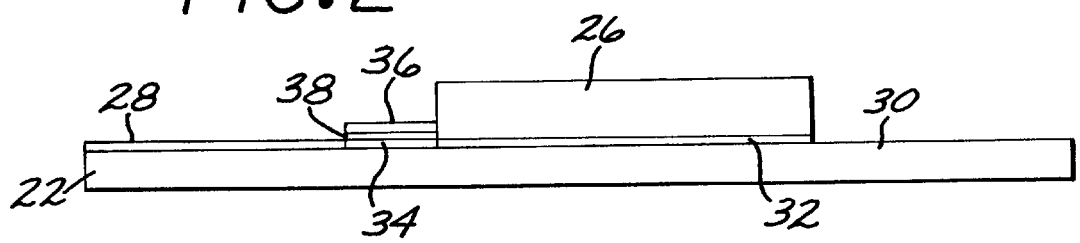
FIG. 2 is a sectional view of the printed circuit board of FIG. 1, taken along line 2—2.

FIG. 2 is a sectional view of the printed circuit board assembly 20. The component 26 is bonded to a surface 30 of the printed circuit board 22 by a layer of adhesive 32. The electrical interconnection between the component 26 and the trace 28 is accomplished through a bonding pad 34 on the surface 30, the bonding pad 34 being in electrical communication with the trace 28. An electrical contact 36 is provided on the component 26, in electrical communication with the circuitry within the component 26. The bonding pad 34 and the electrical contact 36 are joined by a solder layer 38, to provide electrical continuity between the trace 28 and the component 26.

FIG. 3 depicts in block diagram form a preferred approach for practicing the present invention. The printed circuit board 22 is prepared by techniques well known in the art and furnished, numeral 50. A solder is furnished, numeral 52. The solder may be any operable type of solder material. A preferred solder is lead-tin eutectic-composition solder, having a composition of about 63 weight percent tin, about 37 weight percent lead and a eutectic melting temperature of about 183° C.

The solder has at least one (and typically more than one) operable solder temperature/time reflow cycle. This cycle includes a minimum temperature (above the melting point) and a time to which the solder is exposed to cause the solder to flow and wet a surface. Typically, there are many such temperature/time reflow cycles for each type of solder, and the preferred one is a compromise between lower temperature and longer time, versus higher temperature and shorter time. For the case of the preferred eutectic-composition lead-tin solder, the preferred temperature/time reflow cycle is a ramp up that reaches a maximum temperature of about 205° C. from room temperature in about 2½ minutes, and then a cooling to room temperature.

Small amounts of the solder material are applied to the respective bonding pads 34 on the printed circuit board 22, numeral 54, a process termed "tinning" in the art. For each bonding pad, a small amount of the solder material is melted and a droplet applied to the bonding pad, or the solder may be provided in solid form and then melted ultrasonically or by other technique. The result is a wetted layer of solder 38 on each bonding pad 34.

The component 26 to be affixed to the printed circuit board 22 is prepared by techniques well known in the art for each particular type of component and furnished, numeral 56.

The adhesive to be used in the layer 32 is furnished, numeral 58. The adhesive layer performs the functions of adhering the component 26 to the printed circuit board 22, as well as conducting heat from the component 26 where necessary. That is, the adhesive must have acceptable mechanical properties, and must also have acceptable physical properties such as, for example, good thermal conductivity and low outgassing properties if the adhesive is to be used in a spacecraft application.

The adhesive is furnished in an uncured, flowable form. After application to the elements to be bonded, the adhesive is cured by heating to elevated temperature for a period of time to cause the polymers in the adhesive to cross link or otherwise harden. The adhesive has at least one (and typically more than one) operable adhesive temperature/time curing cycle, which is known and recommended by the manufacturer for each type of adhesive. This cycle typically includes a family of operable temperatures and times, with higher temperatures associated with shorter times, which will achieve acceptable curing of the adhesive.

The adhesive selected for the present application requires that the adhesive temperature/time curing cycle permits the adhesive to cure consistently with, during, and within the solder temperature/time reflow cycle. That is, the two cycles need not be identical, but the adhesive temperature/time curing cycle must be such that acceptable curing is achieved when it is subjected to the solder temperature/time reflow cycle. As an example, if at a temperature of 190° C. the solder requires 2 minutes to reflow, and a first candidate adhesive cures in 5 minutes, that first candidate adhesive would not be acceptable. If a second candidate adhesive were to cure in 1 minute at 190° C., it would be acceptable because practice of the solder temperature/time reflow cycle would achieve curing of the second candidate adhesive. If a third candidate adhesive were damaged by being heated to the relatively high temperature of 190° C., it also would not be acceptable.

In the present case, the preferred adhesive is a mineral-filled polyurethane, mixed with glass beads. The polyurethane is polymerized from polyol/carbonyl oligomer precursor resin using an appropriate catalyst. The FTIR spectrum of the preferred and known adhesive of this type, Dis-A-Paste 2310 adhesive available from Aptek Laboratories, Valencia, Calif., is shown in FIG. 4. The resin is mixed with a mineral filler, typically aluminum oxide particles, that has a relatively high thermal conductivity to improve the thermal conductivity of the adhesive, while being electrically insulative. Preferably, the resin is present in an amount of from about 25 to about 38 percent by weight, and the mineral filler is present in an amount of from about 75 to about 62 percent by weight. Optionally, from about 0.1 to about 2 percent by weight of glass beads may be mixed with the resin/filler mix. The glass beads are typically about 0.005 inches to about 0.007 inches in diameter. The glass beads present in the adhesive bondline prevent the areas being bonded from contacting each other and extruding the adhesive from the bondline, prior to curing of the resin.

The adhesive must meet several other requirements in the applications of most interest to the inventors.

The adhesive must have a glass transition temperature of about −60° C. or less. Above the glass transition temperature, the adhesive is relatively flexible and has good fracture toughness, but below the glass transition temperature the adhesive is relatively brittle. Missions of interest to the inventors require the adhesive to reach temperatures nearly as low as −60° C., and therefore the preferred adhesive of the invention must be flexible over the entire temperature range. The filled adhesive of the invention meets this requirement.

The adhesive must have a relatively high thermal conductivity of at least 0.35 BTU/hrft° F., while having relatively low electrical conductivity. The filled adhesive of the invention meets this requirement.

The adhesive desirably has a working life of at least 4 hours at room temperature. The adhesive is initially furnished in a frozen state, thawed, and applied at ambient temperature. The long working life allows the adhesive to be thawed and then used without undue rush in the manufacturing operation.

For the preferred applications, the adhesive must be space qualified with low outgassing, as set forth in NASA Specification SP-R-0022A. This specification requires that the total mass loss (TML) not exceed 1.0 percent and the proportion of collected volatile condensable material (CVCM) be not more than 0.10 percent, when tested by the method of ASTM E595. This testing process is discussed in W. Campbell, Jr. and R. Marriott, *Outgassing Data for Selected Spacecraft Materials*, NASA Reference Publication 1124 Revised (1987), pages 1–3. The preferred adhesive discussed above meets this requirement.

The adhesive is applied to either the face of the component 26 that is to be bonded to the surface of the printed circuit board 22, to the location on the printed circuit board to which the component is to be bonded, or both. In the illustrated preferred case, the adhesive is applied to the face of the component 26 that is to be bonded, numeral 60.

Figure 5:
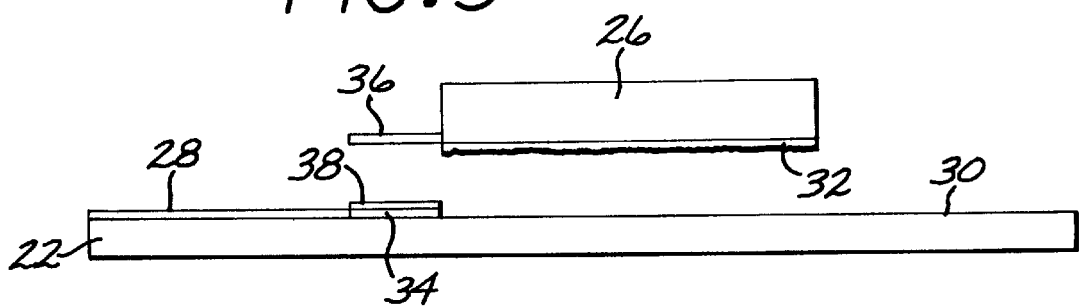
FIG. 5 is a partially exploded rendition of the sectional view of FIG. 2.

The components 26 are positioned and assembled to the proper locations on the printed circuit board 22, numeral 62. This step 62 also brings the bonding pads 34 on the printed circuit boards 22 into facing contact with the electrical contacts 36, as illustrated in FIG. 5, during the assembly. From the position shown in FIG. 5, the component 26 is lowered into place to contact the adhesive 32 already applied on the component 26 to the printed circuit board 22, and to contact the electrical contact 36 to the solder layer 38, which is already tinned to the bonding pad 34.

Figure 7:
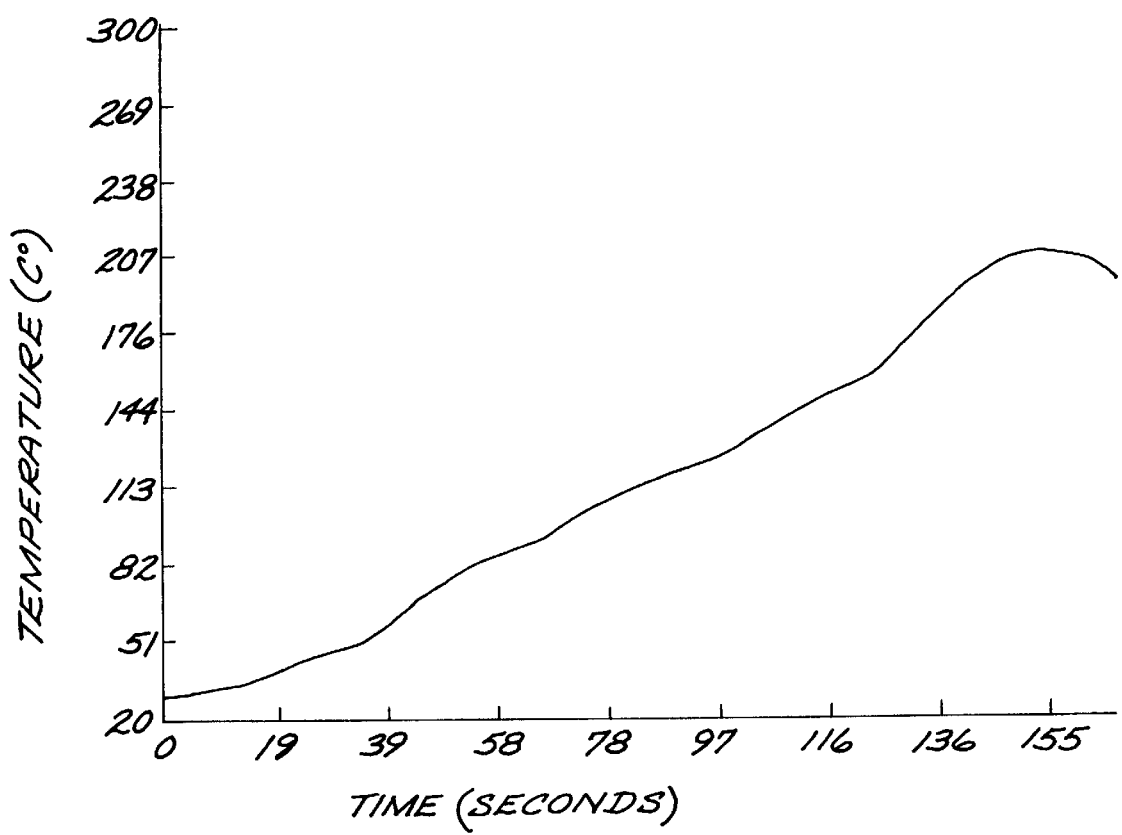
FIG. 7 is a temperature/time plot during heating in a solder temperature/time reflow cycle.

The assembly is heated, numeral 64, as by being placed in an oven, to undergo the solder temperature/time reflow cycle. FIG. 6 schematically illustrates such a solder temperature/time reflow cycle. The solder is melted and reflowed to wet the electrical contact 36, during the period when the temperature of the solder is greater than the melting temperature of the solder $T_M$. Upon subsequent cooling to below the melting point of the solder, the solder layer 38 solidifies and forms a permanent mechanical and electrical contact between the bonding pads 34 and their respective electrical contacts 36. FIG. 7 is a temperature-time plot for an actual solder temperature/time reflow cycle produced by a moving belt upon which prototype assemblies were placed and moved in a continuous fashion through the oven. Heating to the maximum temperature is completed in about 2½ minutes. The assembly is thereafter cooled to room temperature, with the total cycle time being about 3 minutes.

During this same solder temperature/time reflow cycle, the adhesive cures, as the adhesive was selected to cure within the solder temperature/time reflow cycle. The cured adhesive mechanically bonds the component 26 to the printed circuit board 22. The result is the printed circuit board system of FIG. 1.

This approach for fabricating the printed circuit is to be contrasted with the commonly used approach. In that prior practice, the adhesive is applied to the component, the component is contacted to the printed circuit board, and the assembly is heated to the adhesive cure temperature and time, which required over 2 hours for conventional adhesive materials that meet the material property requirements for the present application. The electrical contacts were then individually soldered in a separate operation. This process required substantially longer times and greater capital investment in curing furnaces than does the present approach.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A method of fabricating an electronic assembly, comprising the steps of:

furnishing a support having an electrical bonding pad thereon;

furnishing metallic solder having a solder temperature/time reflow cycle;

tinning the solder to the electrical bonding pad of the support;

furnishing an electronic component having an electrical contact thereon;

furnishing an adhesive having an adhesive temperature/time curing cycle permitting the adhesive to cure during the solder temperature/time reflow cycle;

applying the adhesive to at least one of the component and a bonding location on the support to which the component is to be attached;

contacting the component to the bonding location and the electrical contact to the electrical bonding pad; and thereafter heating the component and the support to an elevated temperature following the solder temperature/time reflow cycle so that, in a single heating cycle, the adhesive is cured and the solder is simultaneously reflowed.

2. The method of claim 1, wherein the support is a printed circuit board.

3. The method of claim 1, wherein the solder is lead-tin eutectic solder.

4. The method of claim 1, wherein the adhesive has a total mass loss that does not exceed 1.0 percent and a proportion of collected volatile condensable material of not more than 0.10 percent, when tested by the method of ASTM E595.

5. The method of claim 1, wherein the adhesive has a glass transition temperature no greater than about −60° C.

6. The method of claim 1, wherein the adhesive has a thermal conductivity of greater than about 0.35 BTU/hrft° F.

7. The method of claim 1, wherein the adhesive comprises a polyurethane precursor.

8. The method of claim 1, wherein the adhesive is filled with solid, thermally conducting, electrically insulating particles.

9. The method of claim 1, wherein the adhesive is filled with aluminum oxide particles.

10. The method of claim 1, wherein the adhesive is filled with glass beads.

11. A method of fabricating an electronic assembly, comprising the steps of:

furnishing a printed circuit board having an electrical bonding pad thereon;

furnishing lead-tin eutectic solder;

tinning the solder to the electrical bonding pad of the printed circuit board;

furnishing an electronic component having an electrical contact thereon;

furnishing a filled polyurethane-precursor adhesive;

applying the adhesive to at least one of the component and a bonding location on the printed circuit board to which the component is to be attached;

contacting the component to the bonding location and the electrical contact to the electrical bonding pad; and thereafter heating the component and the printed circuit board to an elevated temperature following a solder temperature/time reflow cycle for the lead-tin eutectic solder.

12. The method of claim 11, wherein the adhesive is filled with solid, thermally conducting, electrically insulating particles.

13. The method of claim 11, wherein the adhesive is filled with aluminum oxide particles.

14. The method of claim 11, wherein the adhesive is filled with glass beads.

15. The method of claim 11, wherein the adhesive has a total mass loss that does not exceed 1.0 percent and a proportion of collected volatile condensable material of not more than 0.10 percent, when tested by the method of ASTM E595.

16. The method of claim 11, wherein the adhesive has a glass transition temperature no greater than about −60° C.

17. The method of claim 11, wherein the adhesive has a thermal conductivity of greater than about 0.35 BTU/hrft° F.

18. A method of fabricating an electronic assembly, comprising the steps of:

furnishing a printed circuit board having an electrical bonding pad thereon;

furnishing lead-tin eutectic solder;

tinning the solder to the electrical bonding pad of the printed circuit board;

furnishing an electronic component having an electrical contact thereon;

finishing a filled adhesive, wherein the adhesive has a total mass loss that does not exceed 1.0 percent and a proportion of collected volatile condensable material of not more than 0.10 percent, when tested by the method of ASTM E595, the adhesive has a glass transition temperature no greater than about −60° C., and the adhesive has a thermal conductivity of greater than about 0.35 BTU/hrft° F.;

applying the adhesive to at least one of the component and a bonding location on the printed circuit board to which the component is to be attached;

contacting the component to the bonding location and the electrical contact to the electrical bonding pad; and thereafter heating the component and the printed circuit board to an elevated temperature following a solder temperature/time reflow cycle for the lead-tin eutectic solder.

19. The method of claim 18, wherein the adhesive is filled with solid, thermally conducting, electrically insulating particles.

20. The method of claim 1, wherein the adhesive is polymerized from polyol/carbonyl oligomer precursor resin.

* * * * *